United States Patent
Bao et al.

(10) Patent No.: US 12,155,352 B2
(45) Date of Patent: Nov. 26, 2024

(54) POWER AMPLIFIER ARRANGEMENT

(71) Applicant: Telefonaktiebolaget LM Ericsson (publ), Stockholm (SE)

(72) Inventors: Mingquan Bao, Västra Frölunda (SE); David Gustafsson, Sävedalen (SE); Kristoffer Andersson, Gothenburg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 621 days.

(21) Appl. No.: 17/432,779

(22) PCT Filed: Mar. 13, 2019

(86) PCT No.: PCT/EP2019/056302
§ 371 (c)(1),
(2) Date: Aug. 20, 2021

(87) PCT Pub. No.: WO2020/182305
PCT Pub. Date: Sep. 17, 2020

(65) Prior Publication Data
US 2022/0006429 A1    Jan. 6, 2022

(51) Int. Cl.
*H03F 1/07* (2006.01)
*H03F 1/02* (2006.01)
(Continued)

(52) U.S. Cl.
CPC .......... *H03F 1/0288* (2013.01); *H03F 1/56* (2013.01); *H03F 3/195* (2013.01); *H03F 3/211* (2013.01);
(Continued)

(58) Field of Classification Search
CPC ............... H03F 1/07; H03F 1/02; H03F 3/191
(Continued)

(56) References Cited

U.S. PATENT DOCUMENTS

| 6,057,731 A * | 5/2000 | Gorcea ..................... H03F 3/34 330/84 |
| 6,889,034 B1 * | 5/2005 | Dent ........................ H01Q 5/50 455/121 |

(Continued)

FOREIGN PATENT DOCUMENTS

EP    3343762 A1    7/2018

OTHER PUBLICATIONS

Chen, D. et al., "A V-Band Doherty Power Amplifier Based on Voltage Combination and Balance Compensation Marchand Balun", IEEE Access, Mar. 15, 2018, pp. 10131-10138, vol. 6.
(Continued)

*Primary Examiner* — Henry Choe
(74) *Attorney, Agent, or Firm* — COATS & BENNETT, PLLC

(57) ABSTRACT

The embodiments herein relate to a power amplifier arrangement (100) comprising a main amplifier (101) comprising an output connected to a first terminal (110) of a primary winding (105) of a transformer (125). A second terminal (113) of the primary winding (105) is connected to ground (115). The power amplifier arrangement (100) comprises an auxiliary amplifier (103) comprising an output connected to a first terminal (120) of a secondary winding (108) of the transformer (125). A second terminal (118) of the secondary winding (108) is connected to a load (130).

19 Claims, 13 Drawing Sheets

(51) Int. Cl.
*H03F 1/56* (2006.01)
*H03F 3/195* (2006.01)
*H03F 3/21* (2006.01)
*H03F 3/24* (2006.01)
*H03F 3/60* (2006.01)

(52) U.S. Cl.
CPC ............. *H03F 3/245* (2013.01); *H03F 3/602* (2013.01); *H03F 2200/222* (2013.01); *H03F 2200/387* (2013.01); *H03F 2200/451* (2013.01); *H03F 2200/541* (2013.01)

(58) Field of Classification Search
USPC ...................................... 330/124 R, 295, 302
See application file for complete search history.

(56) References Cited

U.S. PATENT DOCUMENTS

| | | | | |
|---|---|---|---|---|
| 8,975,955 | B2* | 3/2015 | Acimovic | H03F 3/04 330/295 |
| 9,467,115 | B2 | 10/2016 | Lyalin | |
| 2010/0103043 | A1* | 4/2010 | Milano | H03B 5/1852 342/368 |
| 2015/0200435 | A1* | 7/2015 | Guimaraes | H03F 3/602 455/73 |
| 2019/0131938 | A1* | 5/2019 | Qureshi | H03F 3/193 |

OTHER PUBLICATIONS

Vorapipat, V. et al., "A Class-G Voltage-Mode Doherty Power Amplifier", IEEE Journal of Solid-State Circuits, Dec. 2017, pp. 3348-3360, vol. 52, No. 12.

Kaymaksut, E., "Transformer-Based Doherty Power Amplifiers for mm-Wave Applications in 40-nm CMOS", IEEE Transactions on Microwave Theory and Techniques, Apr. 2015, pp. 1186-1192, vol. 63, No. 4.

Ahn, H. et al., "A Highly Efficient WLAN CMOS PA with Two-Winding and Single-Winding Combined Transformer", IEEE Radio Frequency Integrated Circuits Symposium, May 2016, pp. 310-313.

Cho, Y. et al., "Voltage-Combined CMOS Doherty Power Amplifier Based on Transformer", IEEE Transactions on Microwave Theory and Techniques, Nov. 2016, pp. 3612-3622, vol. 64, No. 11.

Yin, Y. et al., "A Compact Dual-Band Digital Doherty Power Amplifier Using Parallel-Combining Transformer for Cellular NB-IoT Applications", IEEE International Solid-State Circuits Conference, Feb. 14, 2018, pp. 407-409.

Hu, S. et al., "Design of a Transformer-Based Reconfigurable Digital Polar Doherty Power Amplifier Fully Integrated in Bulk CMOS", IEEE Journal of Solid-State Circuits, May 2015, pp. 1094-1106, vol. 50, No. 5.

Kaymaksut, E., "Transformer-Based Uneven Doherty Power Amplifier in 90 nm CMOS for WLAN Applications", EEE Journal of Solid-State Circuits, Jul. 2012, pp. 1659-1671, vol. 47, No. 7.

* cited by examiner

POWER AMPLIFIER ARRANGEMENT

TECHNICAL FIELD

Embodiments herein relate generally to a power amplifier arrangement, an electronic circuit and an electronic device.

BACKGROUND

In Fifth Generation (5G) communication technology, power amplifiers in millimeter wave transmitters with a large output power and a high Power Added Efficiency (PAE) are highly demanded. The Doherty Power Amplifier (DPA) which comprises a main power amplifier and one auxiliary power amplifier is therefore a good candidate for such applications. The term amplifier is used for the sake of simplicity herein when referring to a power amplifier. The main amplifier may also be referred to as a carrier amplifier and the auxiliary amplifier may also be referred to as a peaking amplifier.

In the DPA, the outputs of the main and the auxiliary amplifiers are combined by a Doherty combiner. The purpose of the Doherty combiner is not only to combine the output powers from the main and auxiliary amplifiers, but also to enable load modulation. In a low-input-power region, only the main amplifier is in the "on" state and is presented with a load that results in maximum efficiency at a power level several decibels (dB) below the saturated output power ($P_{sat}$) of the DPA, typically 6-10 dB below $P_{sat}$. This power level is also called Power Back-Off (PBO). In the high-input-power region, where both the main and auxiliary amplifiers are active, the load presented to the main amplifier is modulated by the auxiliary amplifier, resulting in maintained high efficiency operation over a large output power range.

There are several types of Doherty combiners. Originally, the Doherty combiner is a transmission line with a quarter wavelength functioning as an impedance inverter between the auxiliary amplifier and the main amplifier. However, a transformer-based Doherty combiner utilizing a single transformer or a parallel/series-combining-transformer is another type.

A transformer-based Doherty combiner is shown in FIG. 1 and extends the bandwidth of Doherty power amplifier. FIG. 1 shows a main amplifier 101 and an auxiliary amplifier 103. The main amplifier 101 and the auxiliary amplifier 103 are represented by a current source, $I_{carrier}$ and $I_{peaking}$, respectively. The two current sources have a 90° phase difference. The output of the main amplifier 101 is connected to a first terminal of a transformer's primary winding 105. The output of the auxiliary amplifier 103 is connected to a second terminal of the transformer's first winding 105 through a λ/4 wavelength transmission line. The first terminal of the transformer's secondary winding 108 is connected to a load $R_L$ 130, and the second terminal of the transformer's secondary winding 108 is connected to ground.

A Doherty combiner utilizing a parallel-combining-transformer with 3-windings is shown in FIG. 2. FIG. 2 shows a main amplifier 101 and an auxiliary amplifier 103. The main amplifier 101 is also indicated with PA1 in FIG. 2 and the auxiliary amplifier 103 is indicated with PA2 in FIG. 2, where PA is short for power amplifier. One output of the main amplifier 101 is connected to a first terminal of the transformer's first winding 105. One output of the auxiliary amplifier 103 is connected to the second terminal of the first winding 105. Another output of the main amplifier 101 is connected to a first terminal of the transformer's third winding 109, and another output of the auxiliary amplifier 103 is connected to a second terminal of the third winding 109. The first terminal of the transformer's secondary winding 105 is connected to a load 130, and the second terminal of the transformer's secondary winding 105 is connected to ground. The load 130 may be for example 50Ω.

At millimeter-wave frequency, e.g. >30 GHz, it is common to utilize the transformer-based DPAs, because the transformer-based DPA is able to deal with the low output impedance of the transistors at high frequencies. A single transformer-based DPA is shown in FIG. 3. FIG. 3 shows a main amplifier 101 and an auxiliary amplifier 103, where the amplifiers are represented by voltage sources due to low output impedance. The output of the main amplifier 101 is connected to a first terminal of the transformer's primary winding 105, and the output of the auxiliary amplifier 103 is connected to a second terminal of the primary winding 105. The outputs of two amplifiers have 180° phase difference. The first terminal of the transformer's secondary winding 108 is connected to the load 130, e.g. $R_L$, and the second terminal of the secondary winding 108 is connected to ground.

Transformer-based Doherty power amplifiers may use two transformers in series, as shown in FIG. 4. The primary windings of two transformers are connected with the main and the auxiliary amplifiers separately, while the secondary windings of the transformers are connected in series. FIG. 4 shows two main amplifiers running differential 101a, 101b, which is indicated as carrier amplifier in FIG. 4. FIG. 4 shows two auxiliary amplifiers running differential 103a, 103b, which is indicated as peaking amplifiers in FIG. 4. The output of the first main amplifier 101a is connected to a first terminal of the first transformer's 125a primary winding 105a. The output of the second main amplifier 101b is connected to a second terminal of the first transformer's 125a primary winding 105a. The output of the first auxiliary amplifier 103a is connected to a first terminal of the second transformer's 125b primary winding 105b. The output of the second auxiliary amplifier 103b is connected to a second terminal of the second transformer's 125b primary winding 105b. The first terminal of the first transformer's 125a secondary winding 108a is connected to the first terminal of the second transformer's 125b secondary winding 108b. The second terminal of the first transformer's 125a secondary winding 108a is connected to a load 130. The second terminal of the second transformer's 125b secondary winding 108b is connected to ground. A capacitor 130 is connected in parallel to the second transformer 125b represents the transistors' parasitic capacitor which results in low output impedance If a single transformer is utilized, as shown in FIG. 3, an 180° balun is needed to drive the main amplifier 101 and the auxiliary amplifier 103 differentially, to get 180° anti-phase outputs. The losses of the balun would degrade the DPA's gain and PAE. A balun is a device that converts between a balanced signal and an unbalanced signal.

If two transformers are utilized, losses and a large chip-area associated to the second transformer are unavoidable Therefore, there is a need to at least mitigate or solve these issues.

SUMMARY

An objective of embodiments herein is therefore to obviate at least one of the above disadvantages and to provide an improved power amplifier arrangement.

According to a first aspect, the object is achieved by a power amplifier arrangement comprising a main amplifier. The main amplifier comprises an output connected to a first terminal of a primary winding of a transformer. A second terminal of the primary winding is connected to ground. The power amplifier arrangement comprises an auxiliary amplifier. The auxiliary amplifier comprises an output connected to a first terminal of a secondary winding of the transformer. A second terminal of the secondary winding is connected to a load.

According to a second aspect, the object is achieved by an electronic circuit comprising the power amplifier arrangement described above.

According to a third aspect, the object is achieved by an electronic device comprising the power amplifier arrangement described above.

Since the power amplifier arrangement comprises a single transformer, an improved power amplifier arrangement is provided. The input power is divided into two paths by a power divider driving the main and the auxiliary amplifiers separately. The output of the main amplifier is connected with the primary winding, and the output of the auxiliary amplifier is connected with one terminal of the secondary winding. The outside load is connected with the other terminal of the secondary winding. The currents in the two windings are flowing in the opposite direction, which is utilized to save a balun, as the main and the auxiliary amplifiers connected with the first and the secondary windings separately.

Consequently, the power amplifier arrangement is improved in that for example the loss is reduced and that the size of the power amplifier arrangement is reduced.

Embodiments herein afford many advantages, of which a non-exhaustive list of examples follows:

The main amplifier and the auxiliary amplifiers run in-phase. An advantage of the embodiments herein is that a balun is not necessary. Instead, a power divider such as e.g. a Wilkinson power divider, is used. Another advantage of the embodiments herein is that the loss is reduced since the loss of a power divider is lower than that of a balun.

A power divider with two transmission lines may be used instead of the Wilkinson power divider. The length of the transmission lines is less than a quarter wavelength ($\lambda/4$). In a power divider with two transmission lines, the impedances of the input ports to the main and auxiliary amplifiers are matched to 100Ω, instead of 50Ω in the case with the Wilkinson power divider. With the power divider with two transmission lines, an advantage of the power amplifier arrangement is that it is compact, and the loss associated with the Wilkinson power divider at least reduced. A power divider 140 with two transmission lines may provide about 6 dB isolation, instead of 20 dB for a Wilkinson power divider.

An advantage of the embodiments herein comparing with the known power amplifier arrangement utilizing two transformers is that it has lower loss due to that the losses associated with the second transformer disappear. An additional advantage is that the embodiments herein consumes less chip area.

Another advantage of the embodiments herein is that they provide increased output power and increased efficiency, in addition to reduced loss and reduced chip size.

The embodiments herein are not limited to the features and advantages mentioned above. A person skilled in the art will recognize additional features and advantages upon reading the following detailed description.

BRIEF DESCRIPTION OF THE DRAWINGS

The embodiments herein will now be further described in more detail by way of example only in the following detailed description by reference to the appended drawings illustrating the embodiments and in which.

The drawings are not necessarily to scale and the dimensions of certain features may have been exaggerated for the sake of clarity. Emphasis is instead placed upon illustrating the principle of the embodiments herein.

DETAILED DESCRIPTION

Figure 5:
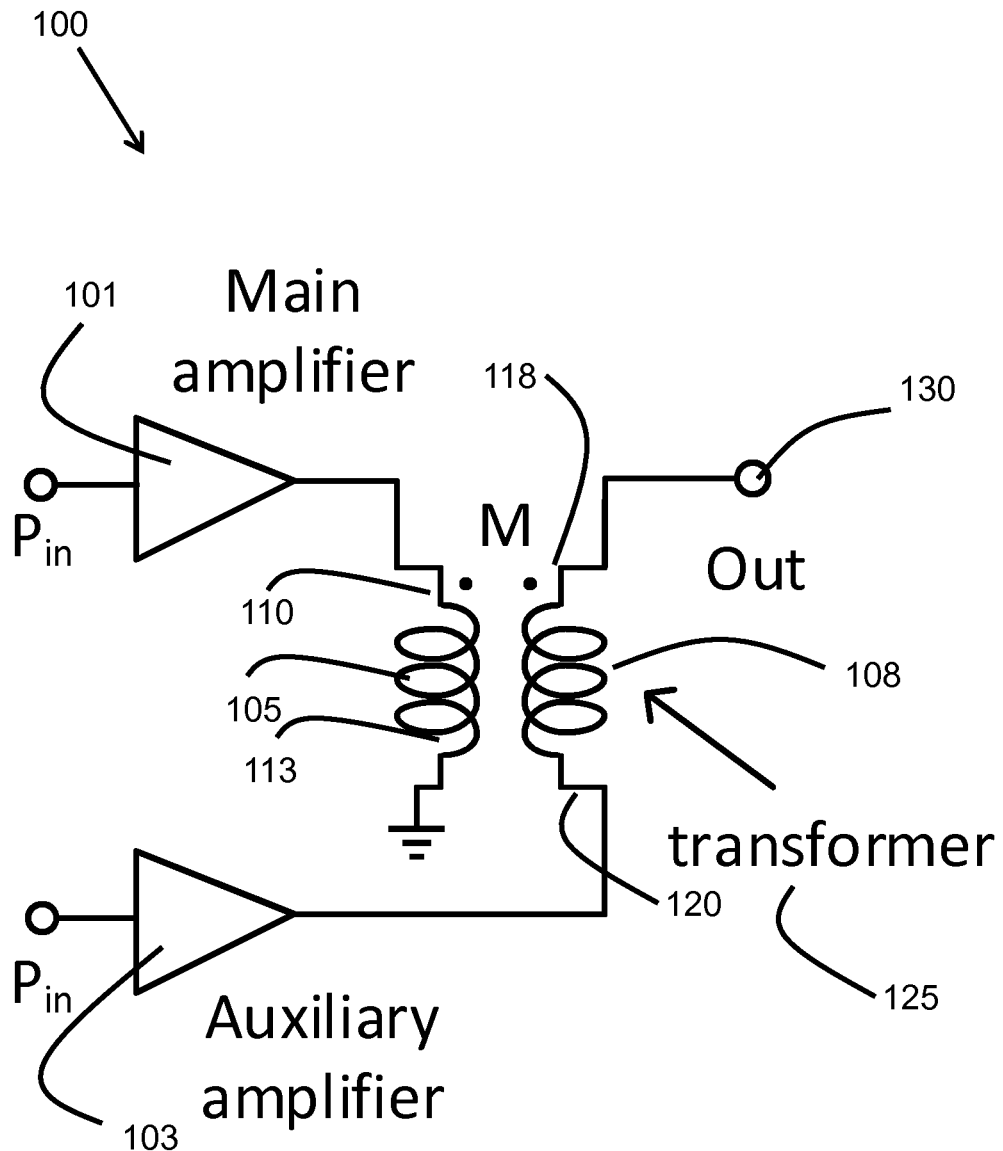
FIG. 5 is a schematic diagram illustrating a power amplifier arrangement.

A power amplifier arrangement 100 with a single transformer 125 is schematically shown in FIG. 5, where M denotes the transformer's mutual inductance. The power amplifier arrangement 100 shows a main amplifier 101 and an auxiliary amplifier 103. The main amplifier 101 may also be referred to as a first amplifier or a carrier amplifier, and the auxiliary amplifier 103 may also be referred to as a second amplifier or a peaking amplifier. The input power to each of the main amplifier 101 and the auxiliary amplifier 103 is indicated with $P_{in}$ in FIG. 5. The input powers for two amplifiers can either be the same value or be different.

The transformer 125 comprises a primary winding 105 and a secondary winding 108. The primary winding 105 may also be described as a primary coil and the secondary winding 108 may also be described as a secondary coil. A current through the primary winding 105 induces current in the secondary winding 108.

The output of the main amplifier 101 is connected with a first terminal 110 of the primary winding 105. The second terminal 113 of the primary winding 105 is connected to ground. The output of the auxiliary amplifier 103 is connected with a second terminal 120 of the secondary winding 108. A load 130 is connected with the first terminal 118 of the secondary winding 108. The load 130 may be for example 500, but can be other values The dots seen on the primary winding 105 and the secondary winding 108 in FIG. 5 are so-called dot marking convention, which is used to denote the polarity of two mutually inductive currents in two windings. The convention is that current entering a transformer at the end of a winding marked with a dot, will tend to produce current exiting other windings at their dotted ends.

The input power to the power amplifier arrangement 100 may be divided into two paths by a power divider (not shown in FIG. 5), where each path drives the main amplifier 101 and the auxiliary amplifier 103 separately. A first path drives the main amplifier 101 and a second path drives the auxiliary amplifier 103. The power divider comprises an input port which provides input power. The input port of the power divider may be seen as being the same as the input port to the power amplifier arrangement 100. The power divider comprises two output ports, i.e. a first output port and a second output port, and these correspond to the two paths in which the input power is divided.

A power divider may also be referred to as a power splitter. There may be different types of power dividers, such as e.g. a Wilkinson power divider, a power divider comprising two transmission lines etc.

Figure 6:
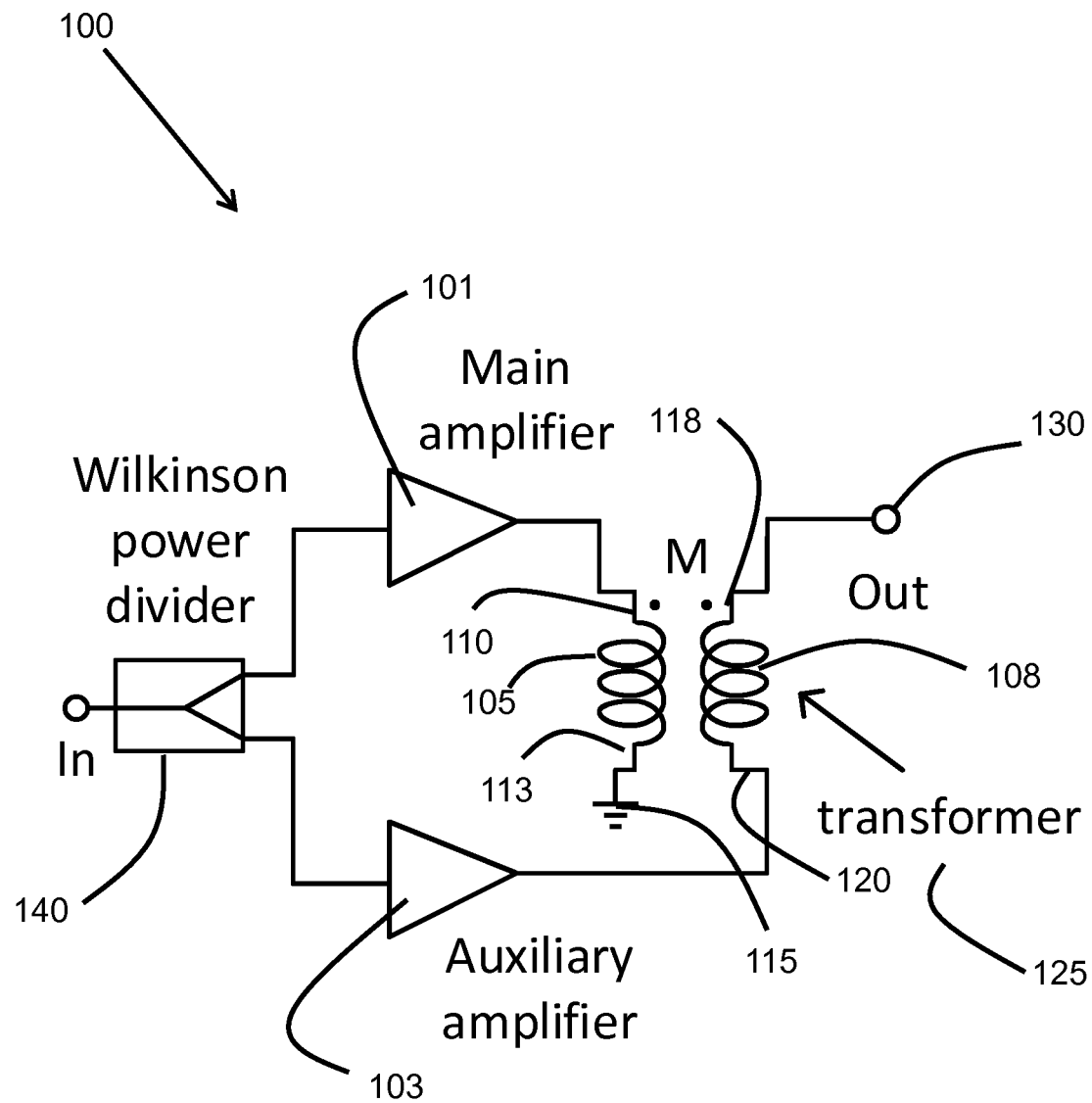
FIG. 6 is a schematic diagram illustrating a power amplifier arrangement.

Utilizing a power divider, the input power of whole power amplifier arrangement 100 is divided into two paths to provide inputs for two amplifiers. An example of a power amplifier arrangement 100 with a Wilkinson power divider 140 is shown in FIG. 6. The Wilkinson power amplifier may be described as having an input port and two output ports, a first arm, a second arm and a resistor between the outputs of the first and second arms. The first and second arms are quarter-wave transmission lines, i.e. λ/4 transmission line. When the input power enters the input port, it is divided into equal-amplitude and equal phase signals at the outputs of the first and second arms. The resistor between the two output ports of the first and second arms enables the two outputs to be matched while also providing isolation between two output ports.

As mentioned above, another type of power divider 140 is a power divider comprising two transmission lines. Its circuit topology is similar to the Wilkinson power divider, but the resistor is removed, and two transmission lines are much shorter than that in Wilkinson power divider.

A power divider provides isolations between its two output ports. Wilkinson power divider has good isolation. The second power divider consisting of two transmission lines has lower isolation but it is still applicable in some cases. The second kind of power divider has lower loss than Wilkinson power divider.

Figure 7:
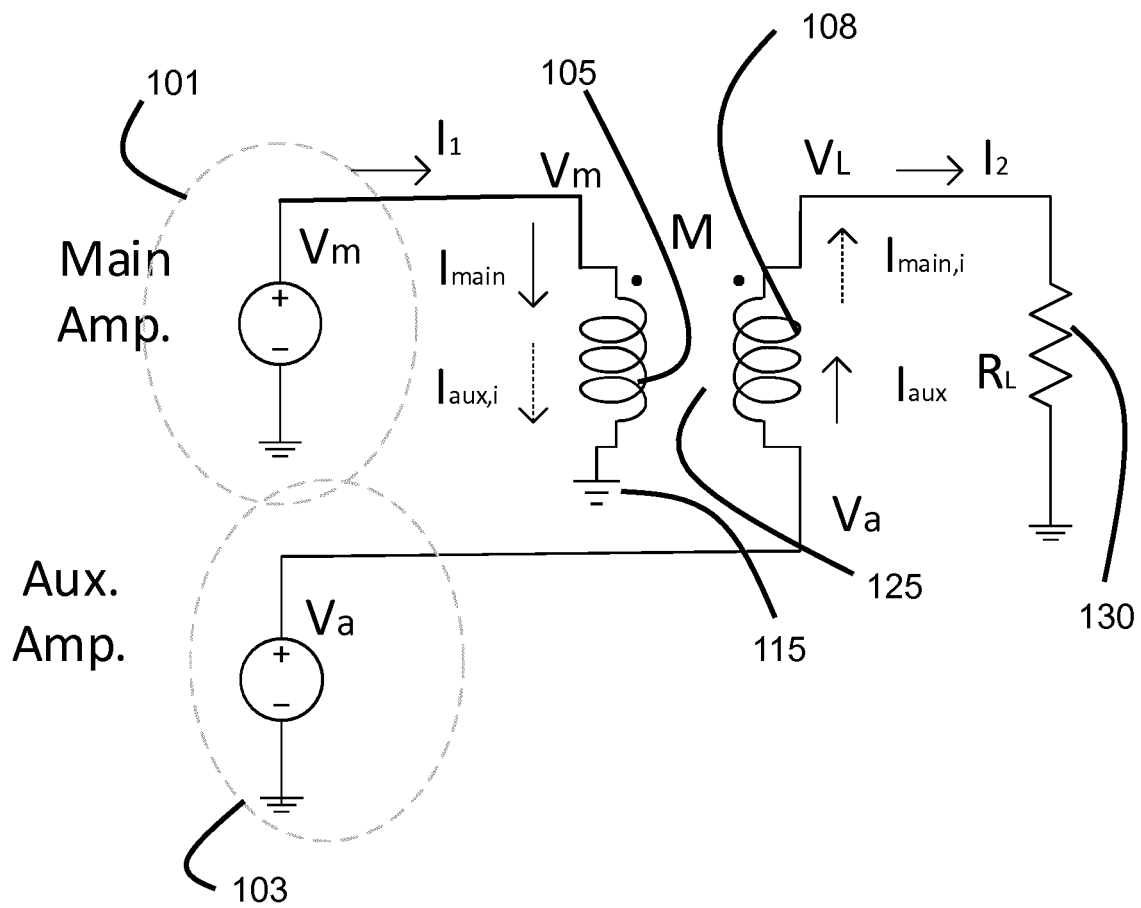
FIG. 7 is a schematic diagram illustrating a power amplifier arrangement.

FIG. 7 shows an example of the power amplifier arrangement 100 where the main and amplifier 101 and the auxiliary amplifier 103 are represented by two voltage sources $V_m$ and $V_a$. The source impedances are ignored in the example of FIG. 7, because, at high frequencies, for instance, frequency >30 GHz, the transistor's output impedance is very low. In a low-input-power region, the auxiliary amplifier 103 is switched off and the main amplifier 101 delivers a current $I_{main}$ to the primary winding 105 and induces a current $I_{main,I}$ at the secondary winding 108. Note that the induced current $I_{main,I}$ and current $I_{main}$ flow are in opposite directions. When the power amplifier arrangement 100 operates in a high-input-power region, the auxiliary amplifier 103 is switched "on", the output current of the auxiliary amplifier 103 $I_{aux}$ will be added on top of $I_{main,I}$. Both the $I_{aux}$ and the $I_{main,I}$ flow in the same direction, towards the output, i.e. towards the load 130. The load 130 is also indicated with $R_L$ in FIG. 7. Therefore, the outputs from the main amplifier 101 and auxiliary amplifier 103 are added in-phase by the transformer 125, as the phase of the output from voltage sources $V_m$ is the same as that from voltage source $V_a$, i.e. the main amplifier 101 and the auxiliary amplifier 103 are derived by in-phase input signals. Therefore, the transformer 125 has a function of power combining. The term "added in phase" refers to that the phase difference of the outputs is zero.

Another function of the transformer 125 may be realizing load modulation. When the auxiliary amplifier 103 is in the state "off", the impedance seen by the main amplifier 101 is $Z_m = V_m/I_{main}$, where $V_m$ is the output voltage of the main amplifier 101. When the auxiliary amplifier 103 is in the state of "on", the induced current $I_{aux,i}$ will added on top of $I_{main}$, and the impedance $Z_m = V_m/(I_{main}+I_{aux,i})$ will drop. Therefore, load modulation is realized which enables increased output power with maintained high efficiency of the power amplifier arrangement 100. The states "on" and "off" which the auxiliary amplifier 103 can be in. The state "on" refers to a state where the auxiliary amplifier 103 delivers a current to the transformer 125. The state "off" refers to a state where the auxiliary amplifier 103 does not deliver any current to the transformer 125. The switch between "off" and "on" may take place automatically, e.g. when the input power to amplifier 103 has exceeded a threshold. However, the main amplifier 101 is always in the "on" state.

Furthermore, the impedance seen by the main amplifier 101 may also derived based on an ideal transformer model. The ideal transformer is lossless and the number of turns for the primary winding 105 is equal to 1, so is the number of the secondary winding 108 of the transformer 125, and then the current in the primary winding is equal to that in the secondary winding, and the voltage across the primary winding is equal to that across the secondary winding:

$$I_1 = I_2 \quad (1a)$$

$$V_m = V_L - V_a \quad (1b)$$

where $I_1$ and $I_2$ are currents following through the primary winding 105 and the secondary winding 108, respectively, and where $V_L$ is the voltage at the load $R_L$ 130:

$$V_L = R_L I_2 \quad (2)$$

Inserting equation (2) into equation (1b) provides:

$$I_2 = \frac{V_m + V_a}{R_L} \quad (3)$$

Then the impedance $Z_m$ seen by the main amplifier 101 is obtained:

$$Z_m = \frac{V_m}{I_1} = \frac{V_m}{I_2} = \frac{R_L}{1 + \left(\frac{V_a}{V_m}\right)} \quad (4)$$

Figure 1:
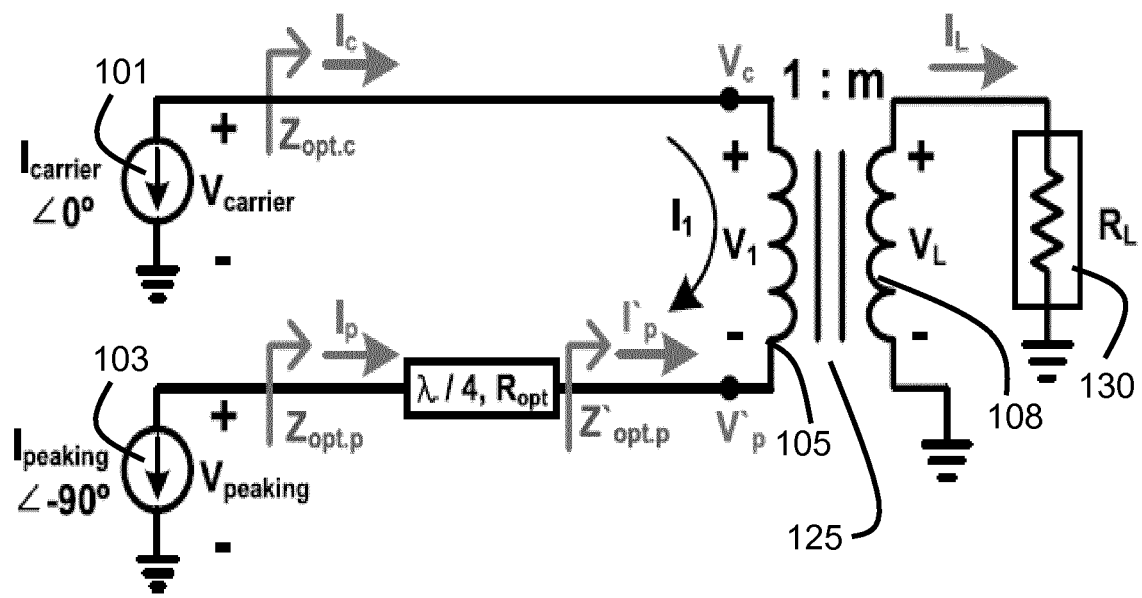
FIG. 1 is a schematic diagram illustrating a single transformer Doherty power amplifier.
Figure 2:
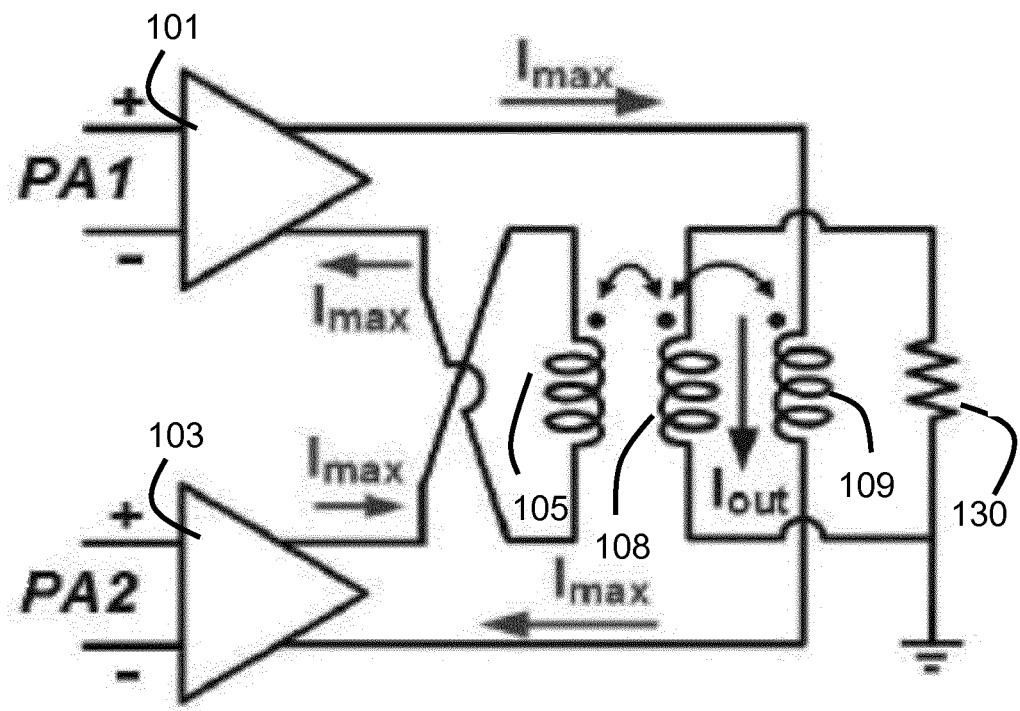
FIG. 2 is a schematic diagram illustrating a Doherty power amplifier with a parallel-combining-transformer.
Figure 3:
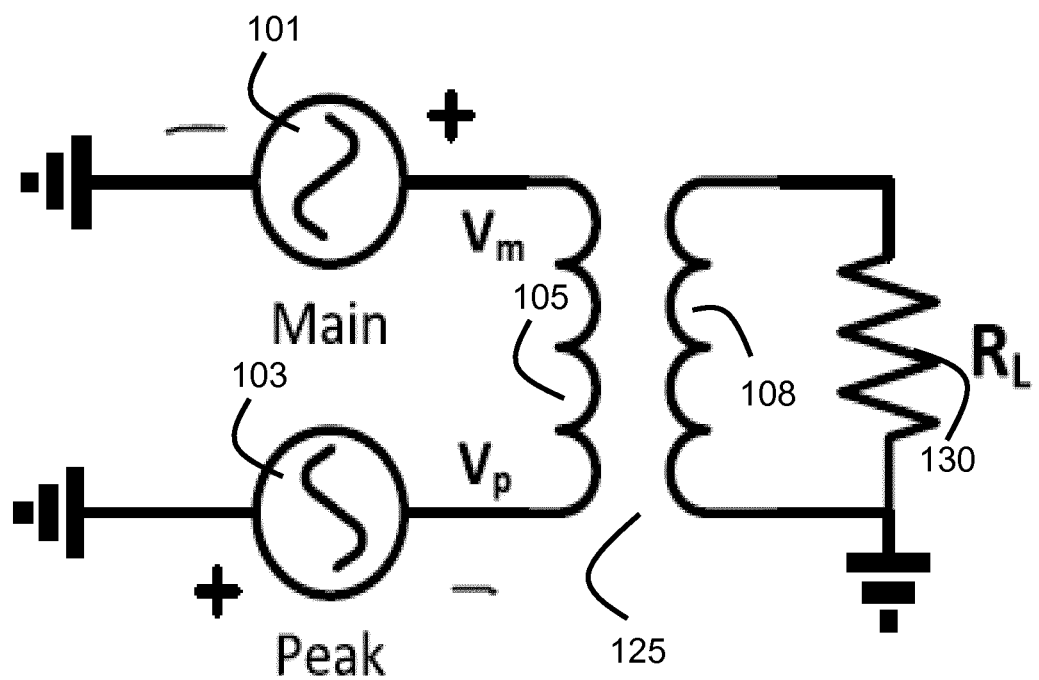
FIG. 3 is a schematic diagram illustrating a voltage-mode Doherty power amplifier with a single transformer.
Figure 4:
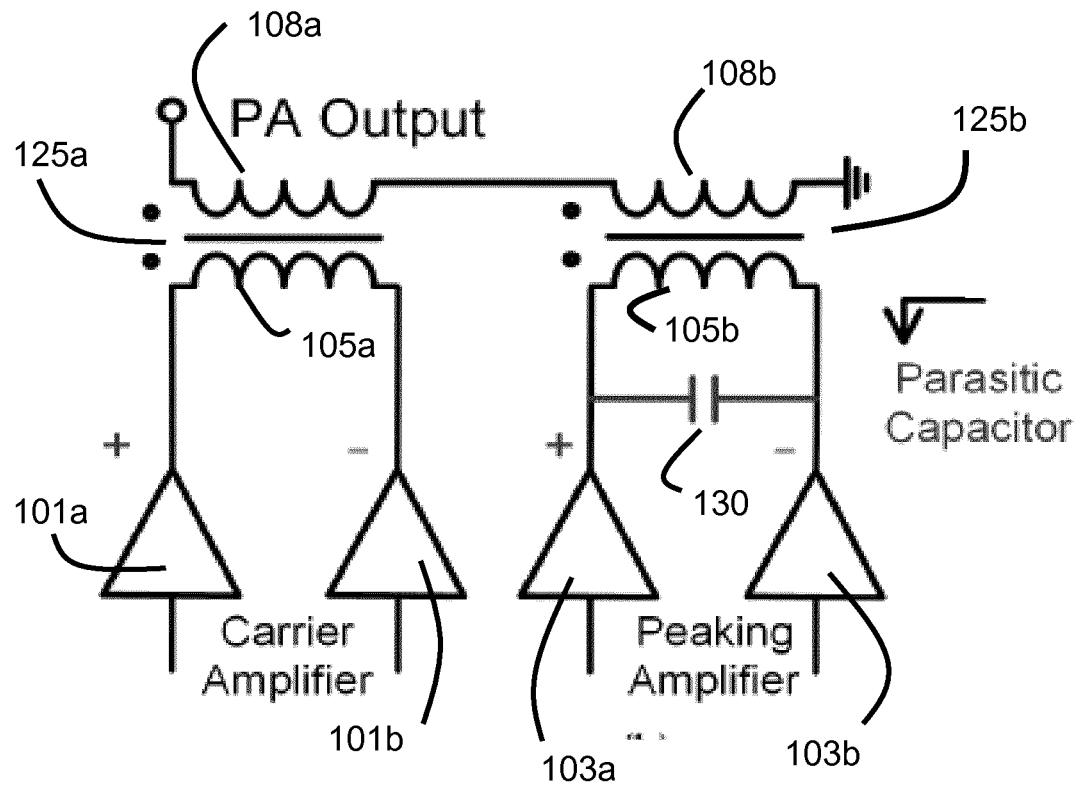
FIG. 4 is a schematic diagram illustrating a Doherty power amplifier with two transformers.

The impedance $Z_m$ seen by the main amplifier 101 will decrease, as the voltage $V_a$ increases, i.e., the auxiliary amplifier 103 starts to work, i.e. it changes from being in an off state to an on state. The equation (4) is the same as the corresponding one for the single-transformer power amplifier arrangement with different configuration, as shown in FIG. 3. Namely, the power amplifier arrangement 100 and the single-transformer DPA shown in FIG. 3 have the same load modulation, if the transformer 125 is an ideal one.

Figure 8:
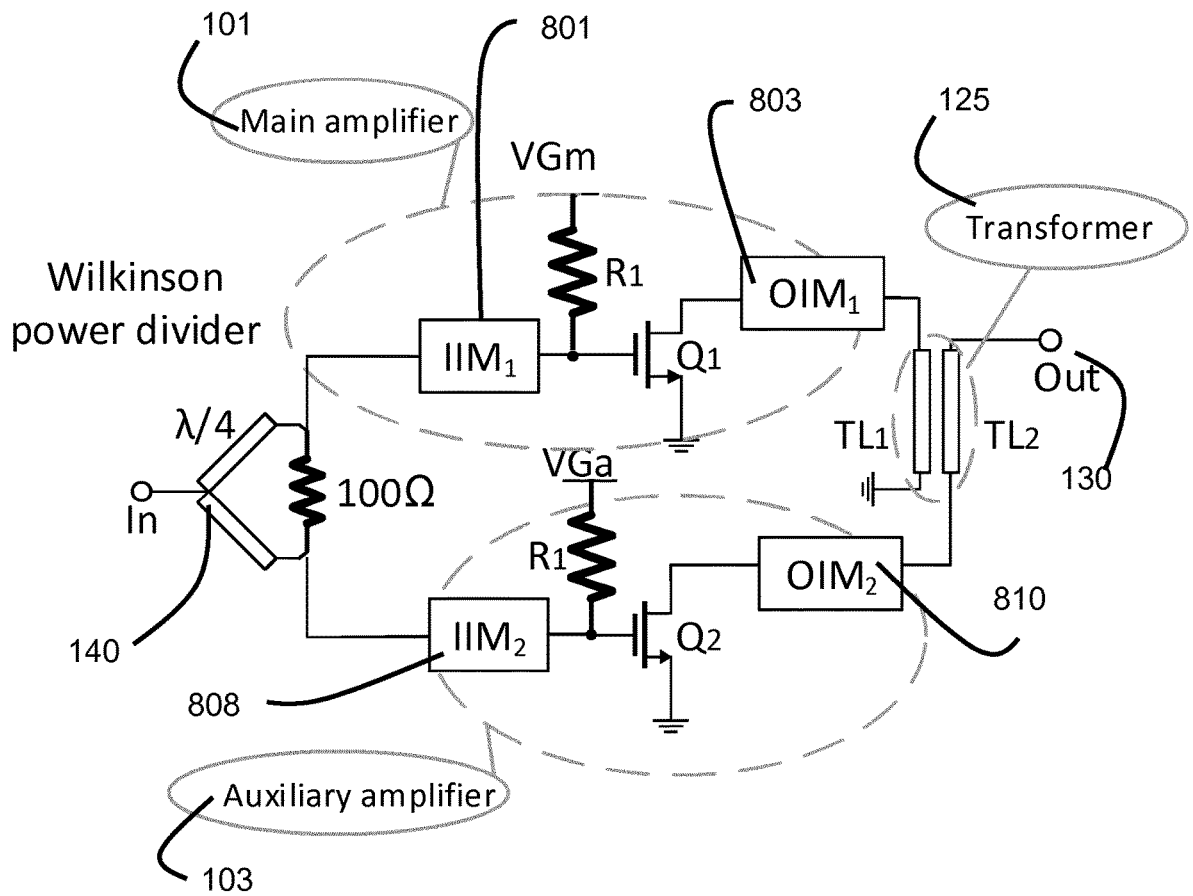
FIG. 8 is a schematic diagram illustrating a single stage power amplifier arrangement.
Figure 9:
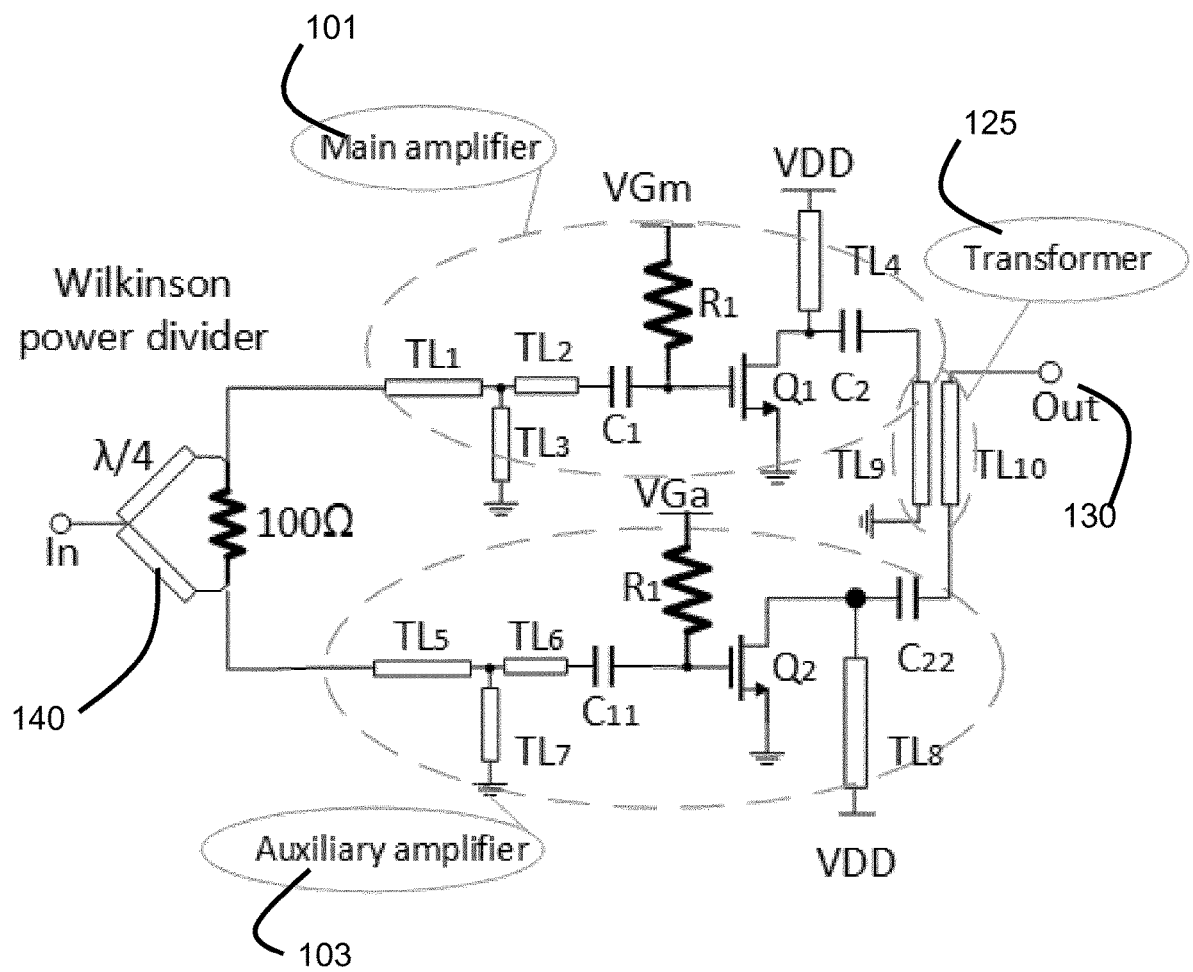
FIG. 9 is a schematic diagram illustrating a single-stage power amplifier arrangement with Wilkinson power divider.

A schematic illustration of an example of the power amplifier arrangement 100 with a Wilkinson power amplifier 140 is shown in FIG. 8 and FIG. 9. FIG. 9 is a more detailed example of the power amplifier 100 in FIG. 8. Note that even though FIGS. 8 and 9 shows an example with a Wilkinson power divider, the power amplifier arrangement 100 may instead comprise a power amplifier with two transmission lines, i.e. the Wilkinson power divider 140 may be replaced by a power divider with two transmission lines.

FIG. 8 shows that the power amplifier arrangement 100 comprises a main amplifier 101, an auxiliary amplifier 103, a transformer 125 and a Wilkinson power divider 140. The two paths in the Wilkinson power divider 140 in FIG. 8 may be based on λ/4 transmission lines and the resistance may be a 100Ω. The main amplifier 101 may comprise a main input impedance matching network $IIM_1$ 801, a main output impedance matching $OIM_1$ 803, and a transistor Q1 with a gate resistance R1. The source of the transistor is grounded. $V_{Gm}$ is the gate bias. The auxiliary amplifier 103 exemplified in FIG. 8 comprises an auxiliary input impedance matching network $IIM_2$ 808, an auxiliary output impedance matching $OIM_1$ 810, and a transistor Q2 with a gate resistance R1. The source of Q2 is grounded t00. $V_{Ga}$ is the gate bias. The transformer 125 comprises a first transmission line $TL_1$ and a second transmission line $TL_2$. The first transmission line $TL_1$ is connected to ground at one end, and the second transmission line $TL_2$ is connected to the load 130 at one end. The term output refers to the output of the power amplifier arrangement 100.

As mentioned above, FIG. 9 shows an example of the power amplifier arrangement 100 with more details compared to FIG. 8. In FIG. 9, a Wilkinson power divider 140 may split the input power into two parts to drive the main amplifier 101 and the auxiliary amplifier 103 separately. The power amplifier arrangement 100 in FIG. 9 is a single-stage power amplifier arrangement. The two paths in the Wilkinson power divider 140 may be based on λ/4 transmission lines and the resistance may be 100Q. For the main amplifier 101, the input impedance matching network $IIM_1$ 801 may comprise transmission lines $TL_1$, $TL_2$, $TL_3$, as well as a capacitor $C_1$. Transmission line $TL_4$ and capacitor $C_2$ are used for output impedance matching $OIM_1$ 803 between the drain of Q1 and the transformer 125. For the auxiliary amplifier 103, the input impedance matching network $IIM_2$ 808 comprises transmission lines $TL_5$, $TL_6$, $TL_7$, as well as a capacitor, $C_{11}$. Transmission line $TL_8$ and a capacitor $C_{22}$ is used for the output impedance matching $OIM_2$ 810 between the drain of Q2 and the transformer 125. Coupled lines $TL_9$ and $TL_{10}$ form a Doherty combiner (transformer). One terminal of $TL_9$ is grounded and the other one is connected with the drain of Q1 via capacitor $C_2$. One terminal of $TL_{10}$ is connected to output port, and the other one is connected with to the drain of Q2 via Capacitor $C_{22}$. FIG. 9 also shows gate resistor R1, and gate biases $V_{Gm}$, $V_{Ga}$, as well as drain supply voltage $V_{DD}$.

Figure 10:
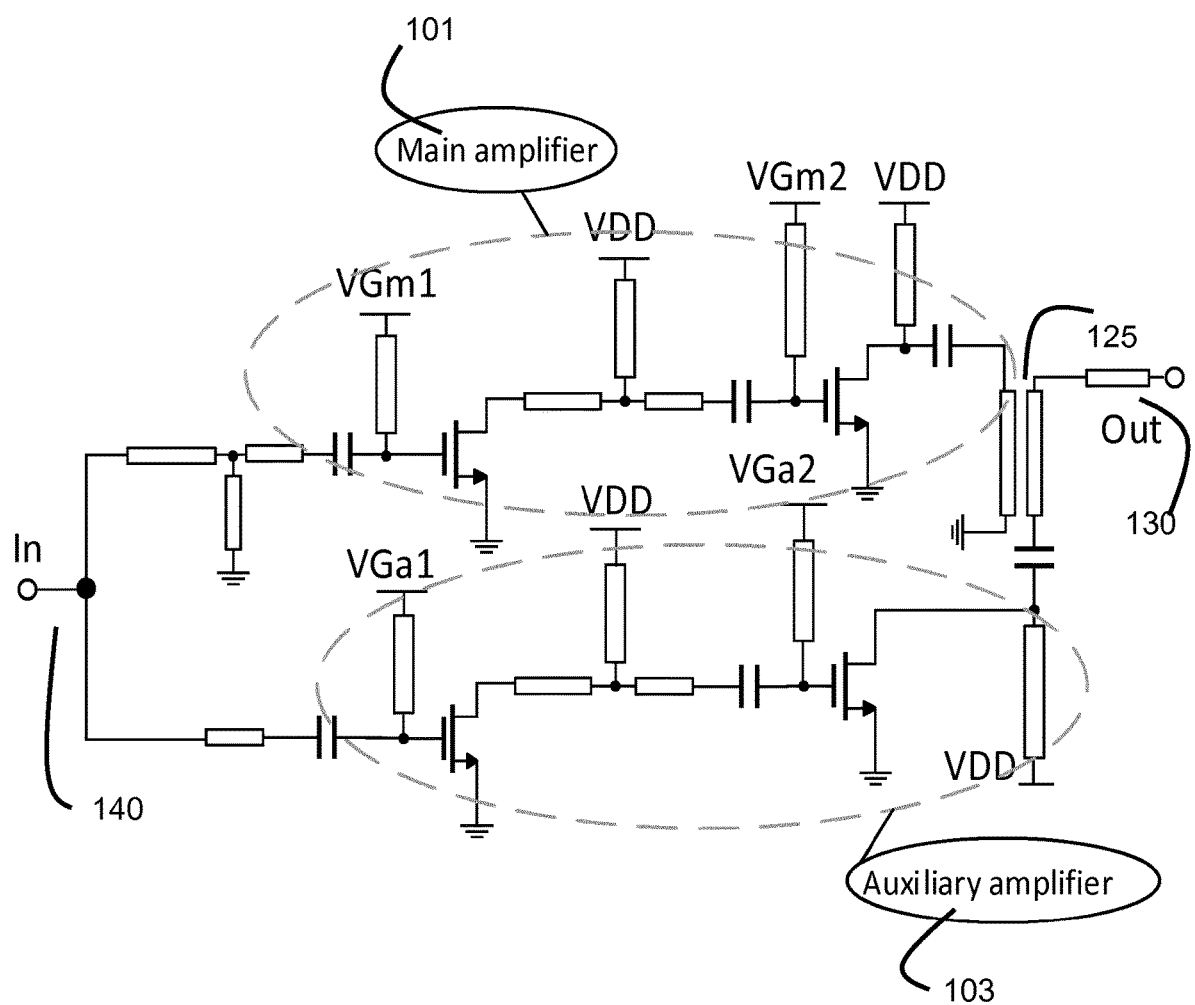
FIG. 10 is a schematic diagram illustrating a two-stage power amplifier arrangement with a two transmission lines divider.

The power amplifier arrangement 100 may be a single stage power amplifier arrangement, a two-stage power amplifier arrangement or a multi-stage power amplifier. A single stage power amplifier arrangement may have a lower gain compared to a two-stage power amplifier arrangement. A schematic example of a two-stage power amplifier arrangement is shown in FIG. 10 where Wilkinson power divider is replaced by two transmission lines connected with the input port in order to reduce the losses. The impedances of the first stage of the main amplifier 101 and the auxiliary amplifier 103 are matched to 100Ω.

A 40 GHz power amplifier arrangement 100 as shown in FIG. 10 may be implemented in a 60 nm GaN technology. A Lange coupler may be used as a transformer 125 to increase the coupling coefficient of the transformer 125. The size of the power amplifier arrangement 100 may be for example 1.13×1.44 mm².

Figure 11:
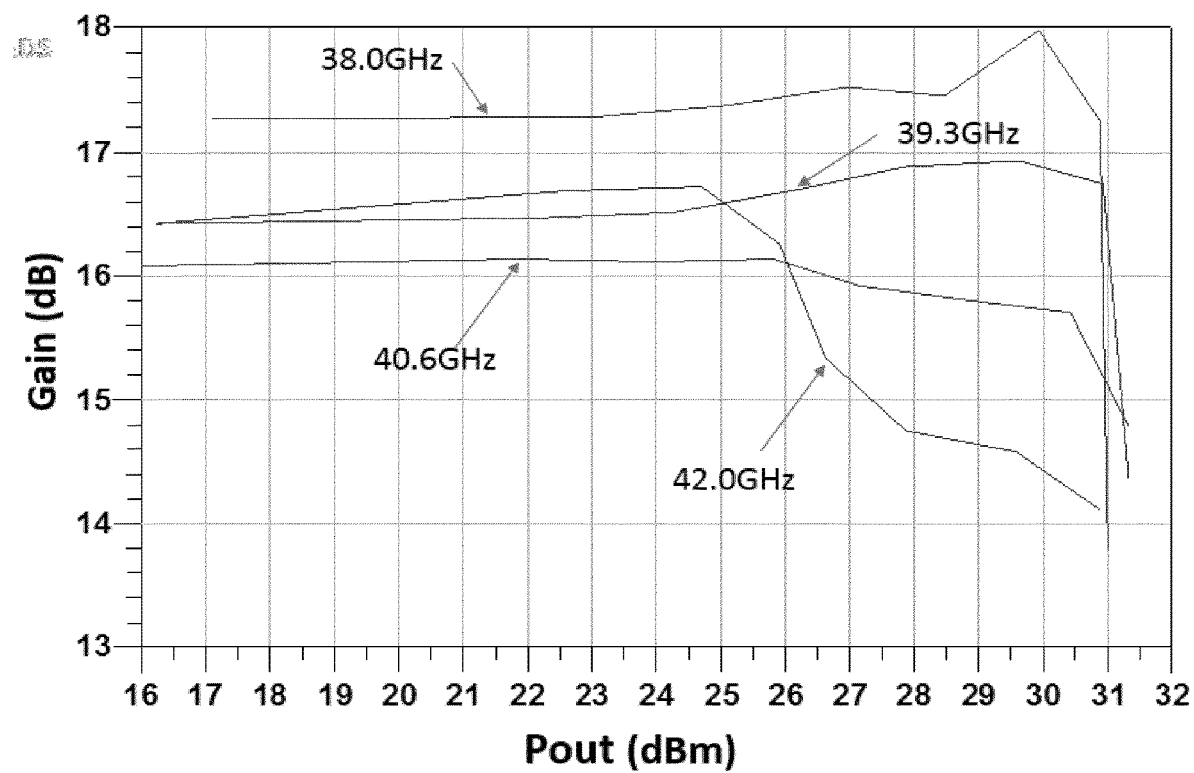
FIG. 11 is a graph illustrating gain of a two-stage power amplifier arrangement versus output power at different frequencies.

FIG. 11 plots the gain versus output power at example frequencies 38.0 GHz, 39.3 GHz, 40.6 GHz, as well as 42.0 GHz for a two-stage power amplifier arrangement 100 with a two transmission lines divider. The x-axis of FIG. 11 represents output power, $P_{out}$, measured in dBm. The y-axis of FIG. 11 represents the gain measured in dB. The small signal gain of the power amplifier arrangement 100 is varied between 16.0 dB to 17.4 dB at different frequencies. As the output power of the power amplifier arrangement 100 increases, the gain of the power amplifier arrangement 100 reduces no more than 3 dB for the given frequencies. The maximum output power of the power amplifier arrangement 100 is around 31 dBm.

Figure 12:
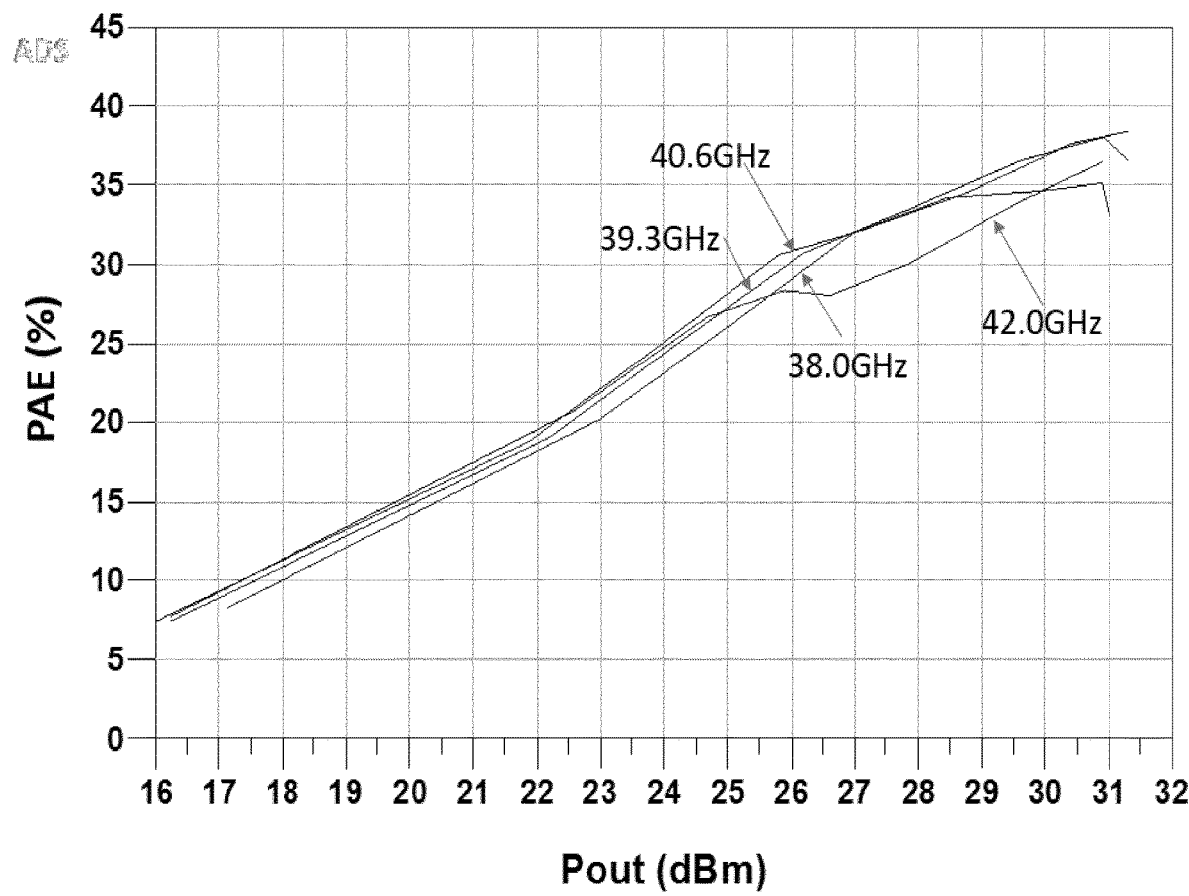
FIG. 12 is a graph illustrating PAE of a two-stage power amplifier arrangement versus output power at different frequencies.

PAEs of the power amplifier arrangement 100 at example frequencies 38.0 GHz, 39.3 GHz, 40.6 GHz, and 42.0 GHz are plotted in FIG. 12. The x-axis of FIG. 12 represents $P_{out}$ measured in dBm and the y-axis represents PAE in %. The maximum PAEs varies between 35% to 38.5% at different frequencies, and the PAE at 6 dB output power back-off (PBO) varies between 26% to 28%. Details of the PAEs at output power equal to 25 dBm and 31 dBm are listed in Table 1 below:

TABLE 1

| Pout (dBm) | 38.0 GHz | 39.3 GHz | 40.6 GHz | 42.0 GHz |
| --- | --- | --- | --- | --- |
| 25 | 26.3% | 27.0% | 28.0% | 27.0% |
| 31 | 35.0% | 37.9% | 38.4% | 36.5% |

Figure 13:
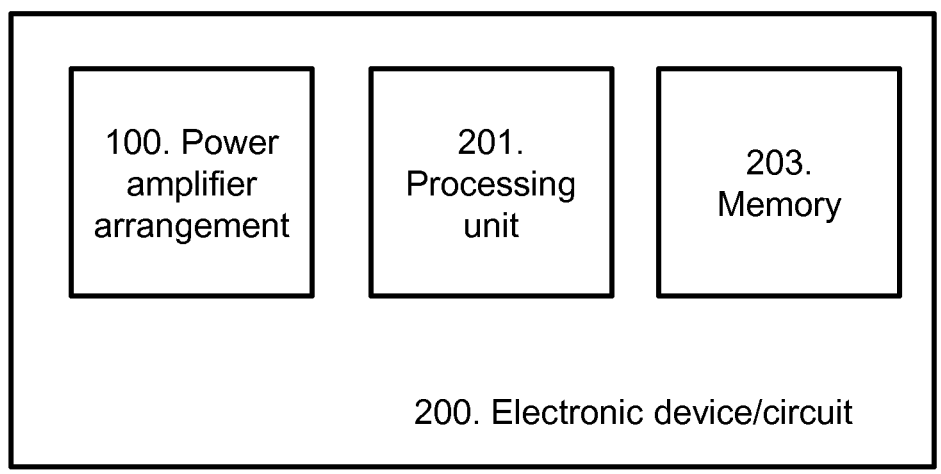
FIG. 13 is a schematic block diagram illustrating an electronic device/circuit.

The power amplifier arrangement 100 according to embodiments herein may be employed in various electronic circuits or apparatus. FIG. 13 shows a block diagram for an electronic circuit 200 or an electronic apparatus 200. The electronic circuit or apparatus 200 comprises the power amplifier arrangement 100 of FIGS. 5-10. The electronic circuit or apparatus 200 may be a transmitter, a transceiver or a unit having transmitting capabilities in a communications system or network. The electronic apparatus 200 may comprise other units, where a memory 203 and a processing unit 201 are shown in FIG. 13. The electronic apparatus 200 may be a user equipment (UE), a mobile device, a communication device, a base station, a radar device etc.

The memory 203 comprises one or more memory units. The memory 203 is arranged to be used to store data, power level measurements, output, input, RF signals, input power, output power, impedance information, capacitance information, arrangement information, threshold values, time periods, configurations, schedulings, and applications to perform the methods herein when being executed in the electronic circuit 200 or the electronic apparatus 200.

The processing unit 201 may be for example a Digital Signal Processor (DSP), Application Specific Integrated Circuit (ASIC) processor, Field-programmable gate array (FPGA) processor or microprocessor. The program code mentioned above may also be provided as a computer program product, for instance in the form of a data carrier carrying computer program code for performing the embodiments herein when being loaded into the electronic circuit 200 and/or the electronic apparatus 200. One such carrier may be in the form of a CD ROM disc. It is however feasible with other data carriers such as a memory stick. The computer program code can furthermore be provided as pure program code on a server and downloaded to the electronic circuit 200 and/or the electronic apparatus 200.

Some embodiments described herein may be summarised in the following manner:

A power amplifier arrangement 100 comprises a main amplifier 101. The main amplifier 101 comprises an output connected to a first terminal 110 of a primary winding 105 of a transformer 125. A second terminal 113 of the primary winding 105 is connected to ground 115. Using other words, the main amplifier 101 comprises an output connected to one terminal 110 of the primary winding 105 of the transformer, and another terminal 115 of the primary winding 105 is connected to ground 115.

The power amplifier arrangement 100 comprises an auxiliary amplifier 103. The auxiliary amplifier 103 comprises an output connected to a first terminal 120 of a secondary winding 108 of the transformer 125. A second terminal 118 of the secondary winding 108 is connected to a load 130. Using other words, the auxiliary amplifier 103 comprises an output connected to one terminal 120 of the secondary winding of the transformer 125, and another terminal 118 of the secondary winding 108 is connected to the load 130.

Thus, the transformer 125 comprises two windings and four terminals 110, 113, 118, 120. The primary winding 105 comprises two terminals, i.e. the first terminal 110 and the second terminal 113 of the primary winding 105. The secondary winding 108 comprises two terminals, i.e. the first terminal 120 and the second terminal 118 of the secondary winding 108. The terminals 118, 120 of the secondary winding 108 may also be referred to as a third terminal 120 and a fourth terminal 118, where the third terminal 120 is the one connected to the output of the auxiliary amplifier 103 and where the fourth terminal 118 is the one connected load 130. The terms first, second, third and fourth is associated with that the transformer 125 in total comprises four terminals.

The main amplifier 101 may be driven by a first RF signal. The auxiliary amplifier 103 may be driven by a second RF signal. The first and second RF signals may be RF-signals that are in-phase.

The power amplifier arrangement 100 may comprise a power divider 140 adapted to divide input power into a first input power to be input to the first amplifier 101 and a second input power to be input to the auxiliary amplifier 103.

The power divider 140 may comprise isolation between a first output port providing the first input power and a second output port providing the second input power.

The power divider 140 may be a Wilkinson power divider or a power divider comprising at least two transmission lines. The term "at least two" may be used interchangeably with multiple or a plurality and indicates that there may be two or more transmission lines. A two-way power divider comprises at least two transmission lines. For a wide bandwidth, the power divider may comprise more than two transmission lines connected in series.

Outputs from the main amplifier 101 and the auxiliary amplifier 103 may be added in-phase by the primary winding 105 and the secondary winding 108 when both the main amplifier 101 and the auxiliary amplifier 103 are in an on state and when the power amplifier arrangement operates in a high-input-power region.

The power amplifier arrangement 100 may be a single stage power amplifier arrangement or a multi-stage power amplifier arrangement.

The main amplifier 101 may comprise a first input impedance matching network 801 and a first output impedance matching network 803. The second amplifier 103 may comprise a second input impedance matching network 808 and a second output impedance matching network 810.

The first input impedance matching network 801 may comprise one or multiple transmission lines and one or multiple capacitors.

The first output impedance matching network 803 may comprise one or multiple transmission lines and one or multiple capacitors.

The second input impedance matching network 808 may comprise one or multiple transmission lines and one or multiple capacitors.

The second output impedance matching network 810 may comprise one or multiple transmission lines and one or multiple capacitors.

The transformer 125 may be at least one of: edge-side coupled, and/or broad side coupled and/or coupled. Thus, the primary winding 105 and the secondary winding 108 may be at least one of: edge-side coupled, and/or broad side coupled and/or coupled. If the power amplifier arrangement 100 has multi metal layers, all coupling types may be be used. If the power amplifier arrangement 100 has only one-metal layer, then, the edge-side coupled type may be used only. Broad side coupling has a relative large coupling between two windings 105, 108.

The power amplifier arrangement 100 may be Doherty power amplifier arrangement.

An electronic circuit 200 may comprise the power amplifier arrangement 100 described herein.

An electronic device 200 may comprise the power amplifier arrangement 100 described herein.

The embodiments herein relates to a transformer based Doherty power amplifier arrangement 100. In other words, the embodiments herein relates to a power amplifier arrangement 100 comprising a single transformer 100. The main amplifier 101 and the auxiliary amplifier 103 are connected with the primary and the secondary windings 105, 108, separately. One terminal of the primary winding 105 is grounded. One terminal of the secondary winding 108 is connected with outside load 130. The main amplifier 101 and the auxiliary amplifier 103 are driven by two in-phase RF signals.

The embodiments herein are not limited to the above described embodiments. Various alternatives, modifications and equivalents may be used. Therefore, the above embodiments should not be taken as limiting the scope of the embodiments, which is defined by the appended claims. A feature from one embodiment may be combined with one or more features of any other embodiment.

The term "at least one of A and B" should be understood to mean "only A, only B, or both A and B.", where A and B are any parameter, number, indication used herein etc.

It should be emphasized that the term "comprises/comprising" when used in this specification is taken to specify the presence of stated features, integers, steps or components, but does not preclude the presence or addition of one or more other features, integers, steps, components or groups thereof. It should also be noted that the words "a" or "an" preceding an element do not exclude the presence of a plurality of such elements.

The term "configured to" used herein may also be referred to as "arranged to", "adapted to", "capable of" or "operative to".

It should also be emphasised that the steps of the methods defined in the appended claims may, without departing from the embodiments herein, be performed in another order than the order in which they appear in the claims.

The invention claimed is:

1. A Doherty power amplifier arrangement, comprising:
a main amplifier comprising an output connected to a first terminal of a primary winding of a transformer, wherein a second terminal of the primary winding is connected to ground; and
an auxiliary amplifier comprising an output connected to a first terminal of a secondary winding of the transformer, wherein a second terminal of the secondary winding is connected to a load;
wherein output currents from the main and auxiliary amplifier flow through the primary and secondary windings of the transformer, respectively, in opposite directions, to realize Doherty amplifier load modulation.

2. The power amplifier arrangement of claim 1:
wherein the main amplifier is driven by a first Radio Frequency (RF) signal and the auxiliary amplifier is driven by a second RF signal; and
wherein the first and second RF signals are RF-signals that are in-phase.

3. The power amplifier arrangement of claim 1, further comprising a power divider adapted to divide input power into a first input power to be input to the first amplifier and a second input power to be input to the auxiliary amplifier.

4. The power amplifier arrangement of claim 3, wherein the power divider comprises isolation between a first output port providing the first input power and a second output port providing the second input power.

5. The power amplifier arrangement of claim 3, wherein the power divider is a Wilkinson power divider or a power divider comprising at least two transmission lines.

6. The power amplifier arrangement of claim 1, wherein outputs from the main amplifier and the auxiliary amplifier are added in-phase by the primary winding and the secondary winding when both the main amplifier and the auxiliary amplifier are in an on state and when the power amplifier arrangement operates in a high-input-power region.

7. The power amplifier arrangement of claim 1, wherein the power amplifier arrangement is a multi stage power amplifier arrangement.

8. The power amplifier arrangement of claim 1, wherein the power amplifier arrangement is a single stage power amplifier arrangement.

9. The power amplifier arrangement of claim 1:
wherein the main amplifier comprises a first input impedance matching network and a first output impedance matching network; and
wherein the second amplifier comprises a second input impedance matching network and a second output impedance matching network.

10. The power amplifier arrangement of claim 9:
wherein the first input impedance matching network comprises one or multiple transmission lines and one or multiple capacitors;
wherein the first output impedance matching network comprises one or multiple transmission lines and one or multiple capacitors;
wherein the second input impedance matching network comprises one or multiple transmission lines and one or multiple capacitors; and
wherein the second output impedance matching network comprises one or multiple transmission lines and one or multiple capacitors.

11. The power amplifier arrangement of claim 1, wherein the transformer is: edge-side coupled, broad side coupled, and/or coupled.

12. An electronic circuit, comprising:
a Doherty power amplifier arrangement, the power amplifier arrangement comprising:
a main amplifier comprising an output connected to a first terminal of a primary winding of a transformer, wherein a second terminal of the primary winding is connected to ground; and
an auxiliary amplifier comprising an output connected to a first terminal of a secondary winding of the transformer, wherein a second terminal of the secondary winding is connected to a load;
wherein output currents from the main and auxiliary amplifier flow through the primary and secondary windings of the transformer, respectively, in opposite directions, to realize Doherty amplifier load modulation.

13. The electronic circuit of claim 12:
wherein the main amplifier is driven by a first Radio Frequency (RF) signal and the auxiliary amplifier is driven by a second RF signal; and
wherein the first and second RF signals are RF-signals that are in-phase.

14. The electronic circuit of claim 12, wherein the power amplifier arrangement further comprises a power divider adapted to divide input power into a first input power to be input to the first amplifier and a second input power to be input to the auxiliary amplifier.

15. The electronic circuit of claim 12, wherein outputs from the main amplifier and the auxiliary amplifier are added in-phase by the primary winding and the secondary winding when both the main amplifier and the auxiliary amplifier are in an on state and when the power amplifier arrangement operates in a high-input-power region.

16. An electronic device, comprising:
a Doherty power amplifier arrangement, the power amplifier arrangement comprising:
a main amplifier comprising an output connected to a first terminal of a primary winding of a transformer, wherein a second terminal of the primary winding is connected to ground; and
an auxiliary amplifier comprising an output connected to a first terminal of a secondary winding of the transformer, wherein a second terminal of the secondary winding is connected to a load;
wherein output currents from the main and auxiliary amplifier flow through the primary and secondary windings of the transformer, respectively, in opposite directions, to realize Doherty amplifier load modulation.

17. The electronic circuit of claim 16:
wherein the main amplifier is driven by a first Radio Frequency (RF) signal and the auxiliary amplifier is driven by a second RF signal; and
wherein the first and second RF signals are RF-signals that are in-phase.

18. The electronic circuit of claim 16, wherein the power amplifier arrangement further comprises a power divider adapted to divide input power into a first input power to be input to the first amplifier and a second input power to be input to the auxiliary amplifier.

19. The electronic circuit of claim 16, wherein outputs from the main amplifier and the auxiliary amplifier are added in-phase by the primary winding and the secondary winding when both the main amplifier and the auxiliary amplifier are in an on state and when the power amplifier arrangement operates in a high-input-power region.

* * * * *